US012353034B2

(12) United States Patent
Huang et al.

(10) Patent No.: US 12,353,034 B2
(45) Date of Patent: *Jul. 8, 2025

(54) OPTICAL INTEGRATED CIRCUIT STRUCTURE INCLUDING EDGE COUPLING PROTECTIVE FEATURES AND METHOD OF FORMING SAME

(71) Applicant: Taiwan Semiconductor Manufacturing Company Limited, Hsinchu (TW)

(72) Inventors: Chen-Hao Huang, Taoyuan (TW); Sui-Ying Hsu, New Taipei (TW); YuehYing Lee, Hsinchu (TW); Chia-Ping Lai, Hsinchu (TW); Chien-Ying Wu, Hsinchu (TW); Hau-Yan Lu, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/589,180

(22) Filed: Feb. 27, 2024

(65) Prior Publication Data

US 2024/0201458 A1 Jun. 20, 2024

Related U.S. Application Data

(63) Continuation of application No. 17/460,789, filed on Aug. 30, 2021, now Pat. No. 11,940,659.

(51) Int. Cl.
*G02B 6/42* (2006.01)
*G02B 6/12* (2006.01)
(Continued)

(52) U.S. Cl.
CPC ............ *G02B 6/4248* (2013.01); *G02B 6/12* (2013.01); *G02B 6/12002* (2013.01);
(Continued)

(58) Field of Classification Search
CPC ........ G02B 6/12004; G02B 6/30; G02B 6/12; G02B 2006/12061; G02B 6/12002;
(Continued)

(56) References Cited

U.S. PATENT DOCUMENTS 4,966,433 A * 10/1990 Blonder ................... G02B 6/30
385/49
5,787,214 A * 7/1998 Harpin ..................... G02B 6/30
385/52

(Continued)

FOREIGN PATENT DOCUMENTS

CN 110520772 A 11/2019
TW 201333567 A 8/2013

OTHER PUBLICATIONS

TW Patent and Trademark Office; TW Application No. 111109260; Office Action mailed Apr. 10, 2025; 8 pages.

*Primary Examiner* — Michelle R Connelly
(74) *Attorney, Agent, or Firm* — The Marbury Law Group, PLLC

(57) ABSTRACT

An optical integrated circuit (IC) structure includes: a substrate including a fiber slot formed in an upper surface of the substrate and extending from an edge of the substrate, and an undercut formed in the upper surface and extending from the fiber slot; a semiconductor layer disposed on the substrate; a dielectric structure disposed on the semiconductor layer; an interconnect structure disposed in the dielectric structure; a plurality of vents that extend through a coupling region of the dielectric structure and expose the undercut; a fiber cavity that extends through the coupling region of dielectric structure and exposes the fiber slot; and a barrier (Continued)

ring disposed in the dielectric structure, the barrier ring surrounding the interconnect structure and routed around the perimeter of the coupling region.

20 Claims, 10 Drawing Sheets

(51) Int. Cl.
*G02B 6/136* (2006.01)
*G02B 6/30* (2006.01)
*H01L 21/306* (2006.01)
*H01L 21/3065* (2006.01)
*H01L 21/311* (2006.01)
*H01L 23/522* (2006.01)
*H01L 23/532* (2006.01)
*H01L 23/58* (2006.01)

(52) U.S. Cl.
CPC ......... *G02B 6/12004* (2013.01); *G02B 6/136* (2013.01); *G02B 6/4206* (2013.01); *G02B 6/4274* (2013.01); *H01L 23/5226* (2013.01); *H01L 23/53228* (2013.01); *G02B 6/30* (2013.01); *G02B 6/4228* (2013.01); *G02B 6/4236* (2013.01); *H01L 21/30604* (2013.01); *H01L 21/3065* (2013.01); *H01L 21/31116* (2013.01); *H01L 23/585* (2013.01)

(58) Field of Classification Search
CPC ...... G02B 6/4248; G02B 6/4243; G02B 6/13; G02B 6/136; G02B 6/423; G02B 6/4251; H01L 23/562; H01L 23/5226; H01L 23/585

See application file for complete search history.

(56) References Cited

U.S. PATENT DOCUMENTS

| | | |
|---|---|---|
| 8,914,968 B2 | 12/2014 | Dayan et al. |
| 9,874,690 B2 | 1/2018 | Gambino et al. |
| 10,714,468 B2 | 7/2020 | Maggi et al. |
| 10,770,412 B2 | 9/2020 | Polomoff et al. |
| 11,269,141 B2 | 3/2022 | Boeuf et al. |
| 11,543,606 B2 | 1/2023 | Polomoff et al. |
| 11,740,418 B2 | 8/2023 | Polomoff et al. |
| 11,809,000 B2 | 11/2023 | Yu et al. |
| 11,940,659 B2 * | 3/2024 | Huang ................ G02B 6/136 |
| 2020/0006304 A1 * | 1/2020 | Chang .................. H01L 23/48 |
| 2022/0011404 A1 | 1/2022 | Nomura et al. |
| 2022/0299719 A1 | 9/2022 | Yu et al. |
| 2022/0308297 A1 | 9/2022 | Polomoff et al. |

* cited by examiner

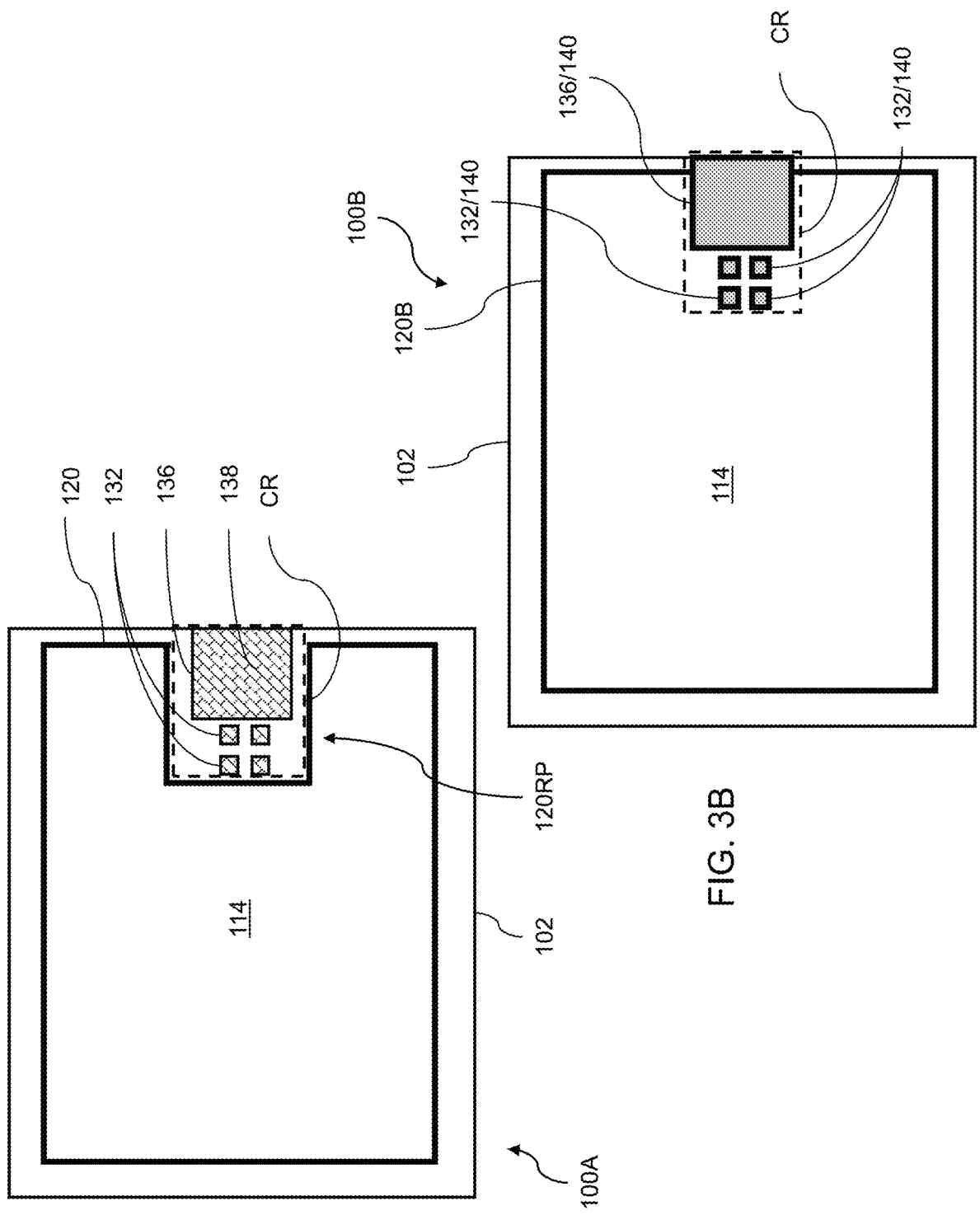

OPTICAL INTEGRATED CIRCUIT STRUCTURE INCLUDING EDGE COUPLING PROTECTIVE FEATURES AND METHOD OF FORMING SAME

RELATED APPLICATIONS

This application is a continuation application of U.S. patent application Ser. No. 17/460,789, entitled "Optical Integrated Circuit Structure Including Edge Coupling Protective Features and Method for Forming the Same", filed Aug. 30, 2021 now issued as U.S. Pat. No. 11,940,659, the entire contents of which are hereby incorporated by reference for all purposes.

BACKGROUND

Optical signals are used for secure, high-speed data transmission between two devices. In some applications, a device capable of optical data transmission includes at least one integrated circuit (IC) or chip having an optical component for transmitting and/or receiving optical signals. Also, the device typically includes one or more other optical or electronic components (e.g. transistors), a waveguide for controlling the propagation of the optical signals from one component to another, and a carrier, such as a substrate of a printed circuit board (PCB), on which the chip equipped with the optical component and the one or more other components are mounted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are simplified top views of IC structures according to alternative embodiments of the present disclosure.

DETAILED DESCRIPTION

Figure 1A:
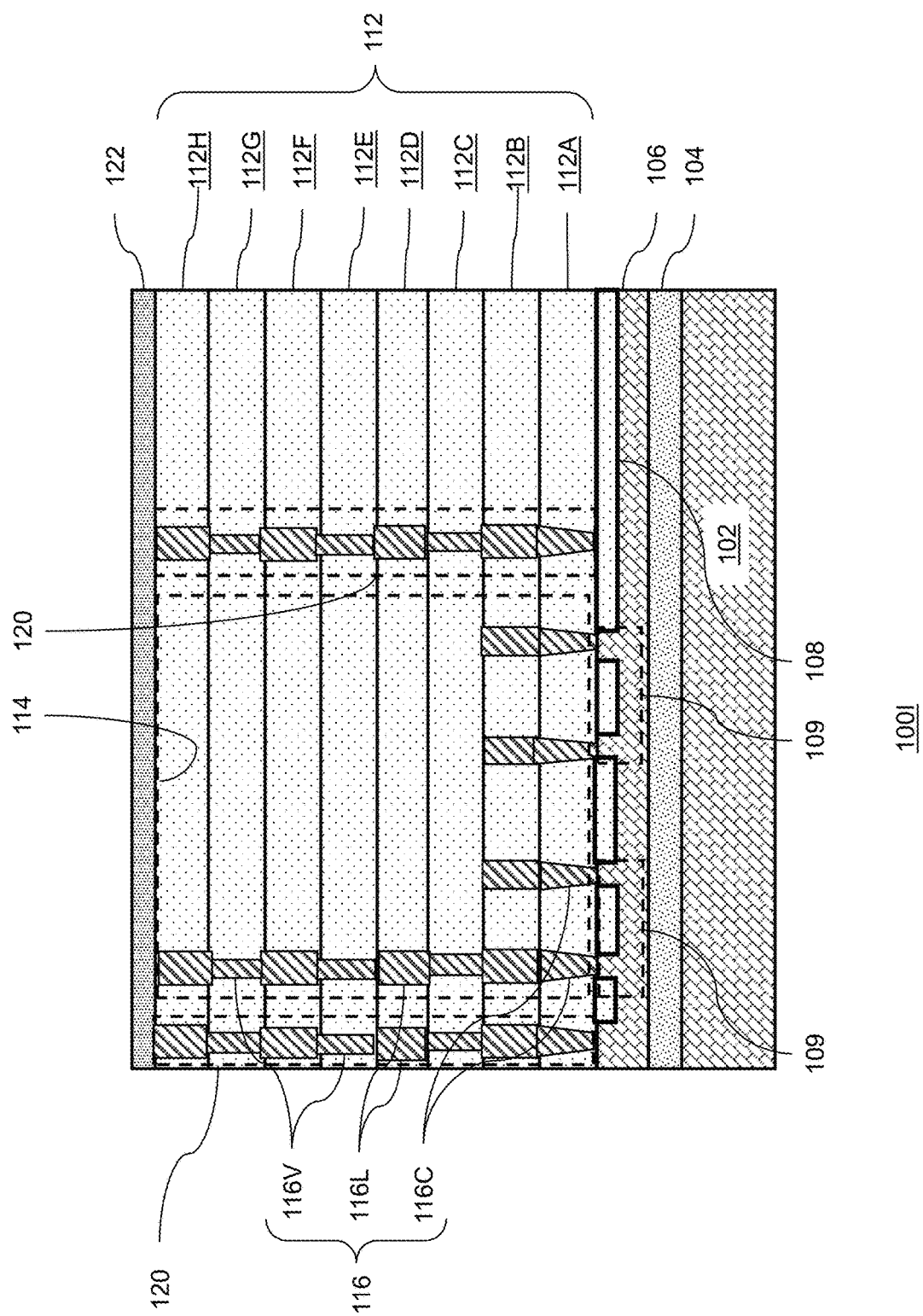
FIG. 1A is a vertical cross-sectional view illustrating an optical integrated circuit (IC) structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Integrated circuit (IC) structures may include various protective elements to prevent physical and/or environmental damage to sensitive elements of such structures. However, conventional protective elements are not designed to be used with optical IC structures that include a coupling region for connecting with an optical fiber. As such, conventional protective elements may not fully protect an optical IC structure.

The present disclosure is directed to integrated circuit (IC) structures including edge coupling protective features and methods of forming the same, and specifically to optical (e.g., photonic) IC structures that include a barrier ring and optionally a barrier layer configured to prevent the diffusion of contaminants.

FIGS. 1A-1F are vertical cross-sectional views showing various stages of forming an optical IC structure, according to various embodiments of the present disclosure. Referring to FIG. 1A, an initial IC structure 100I may include a substrate 102, a bottom oxide layer (BOX) 104, a semiconductor layer 106, and a dielectric structure 112. The initial IC structure 100I may include an application-specific integrated circuit (ASIC) chip, an analog chip, a sensor chip, or the like, and may be configured to send and/or receive optical signals.

In some embodiments, the substrate 102 may include a crystalline material such as silicon or sapphire. Other substrate materials are within the contemplated scope of disclosure. In some embodiments, the substrate 102 may be the substrate of a semiconductor-on-insulator (SOI) structure. In particular, a bottom oxide layer (BOX) 104 may be formed on the substrate 102, the semiconductor layer 106 may be formed on the BOX 104, and a top oxide layer (TOX) 108 may be formed on the semiconductor layer 106.

The semiconductor layer 106 may include a semiconductor material such as silicon, germanium, and/or a compound semiconductor such as silicon germanium, silicon carbide, gallium arsenic, indium arsenide, gallium nitride, or indium phosphide. Other semiconductor materials are within the contemplated scope of disclosure. In some embodiments, the semiconductor layer 106 may include an oxide semiconductor material. In various embodiments, the semiconductor layer 106 may take the form of a planar substrate, a substrate with multiple fins, nanowires, or other forms known to people having ordinary skill in the art. Depending on the requirements of design, the semiconductor layer 106 may include a P-type or an N-type material and may have doped regions therein. The doped regions may be included in devices 109 formed in the semiconductor layer 106.

For example, the semiconductor layer 106 may include a variety of devices 109, which may include active components, passive components, or a combination thereof. In some embodiments, the devices 109 may include integrated circuits devices, for example, transistors, capacitors, resistors, diodes, photodiodes, fuse devices, or other similar devices. In some embodiments, the devices 109 may include light-emitting and/or light-detecting devices. For example, the devices 109 may include light-emitting diodes, lasers, photo sensors, optical modulators, optical couplers, or the like, or combinations thereof.

In some embodiments, the BOX 104 and/or TOX 108 may include a dielectric material, such as silicon dioxide ($SiO_2$), silicon carbide (SIC), carbon nitride (CN), silicon oxynitride (SiON), silicon nitride (SiN), or the like. Other dielectric materials are within the contemplated scope of disclosure. In various embodiments, the BOX 104 may be formed of a material having high light propagation efficiency, such as silicon dioxide or the like. As discussed in detail below, a waveguide may be formed on the BOX 104. In some embodiments, the TOX 108 may be disposed between active regions of the devices 109 formed in the semiconductor layer 106.

The dielectric structure 112 may be disposed on the semiconductor layer 106 and/or TOX 108. In some embodiments, the dielectric structure 112 includes a dielectric material such as silicon oxide, silicon oxynitride, silicon nitride, a low dielectric constant (low-k) material, or a combination thereof. Other dielectric materials are within the contemplated scope of disclosure. The dielectric structure 112 may be a single layer or a multiple-layer dielectric structure. For example, as shown in FIG. 1A, the dielectric structure 112 may include multiple dielectric layers, such as inter-metal dielectric (IMD) layers 112A-112H. However, while the dielectric structure 112 is shown to include 8 dielectric layers in FIG. 1A, the various embodiments of the present disclosure are not limited to any particular number of dielectric layers. More or fewer dielectric layers may be included in the dielectric structure 112.

The dielectric structure 112 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

An interconnect structure 114 and a barrier ring 120 may be disposed within the dielectric structure 112. In some embodiments, with reference to FIGS. 1F, 1G, 3A and 3B, the interconnect structure 114 and the barrier ring 120 may be disposed outside of a coupling region CR of the dielectric structure 112. In particular, the barrier ring 120 may completely or partially surround the interconnect structure 114 and may not extend into the coupling region CR. For example, the barrier ring 120 may completely surround the interconnect structure 114 and may be routed around the coupling region CR, as discussed in detail below with respect to FIG. 1F.

The barrier ring 120 may be configured to prevent contaminants, such as water, ions, and/or etching byproducts from diffusing into the interconnect structure 114 and causing damage such as cracks or dislocations. For example, the barrier ring 120 may have a thickness of at least 10 microns ($\mu m$), such as a thickness ranging from about 10 to about 50 $\mu m$, or from about 11 to about 25 nm.

The interconnect structure 114 may be configured to electrically interconnect the devices 109 of the semiconductor layer 106. For example, the interconnect structure 114 may electrically contact gate electrodes, source electrodes, and/or drain electrodes of the devices 109.

The interconnect structure 114 and the barrier ring 120 may include metal features 116 disposed in the dielectric structure 112. The metal features 116 may be any of a variety of conductive structures and/or films, such as conductive lines 116L, contacts 116C, and/or via structures 116V.

The metal features 116 may be formed of any suitable metal, such as tungsten (W), copper (Cu), a copper alloy, aluminum (Al), an aluminum alloy, combinations thereof, or the like. Other metal materials are within the contemplated scope of disclosure. In some embodiments, barrier layers (not shown) may be disposed between the metal features 116 the dielectric layers of dielectric structure 112, to prevent the material of the metal features 116 from migrating to the semiconductor layer 106. The barrier layers may include Ta, TaN, Ti, TiN, CoW, or combinations thereof, for example. Other barrier layer materials are within the contemplated scope of disclosure.

In some embodiments, the metal features 116 may be formed by a dual-Damascene process or by multiple single Damascene processes. Single-Damascene processes generally form and fill a single feature with metal (e.g., copper) per Damascene stage. Dual-Damascene processes generally form and fill two features with metal at once, e.g., a trench and overlapping through-hole may both be filled with a single copper deposition using dual-Damascene processes. In alternative embodiments, the metal features 116 and barrier ring 120 may be formed by an electroplating process.

For example, the Damascene processes may include patterning a dielectric layer to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric layer.

In particular, the patterning, metal deposition, and planarizing processes may be performed as each of the IMD layers 112A-112H is formed, in order to form the interconnect structure 114 and the barrier ring 120 within each respective IMD layer 112A-112H. For example, IMD layer 112A may be deposited and patterned to form openings. A deposition process may then be performed to fill the openings in the IMD layer 112A. A planarization process may then be performed to remove the overburden and form corresponding metal features 116 of the interconnect structure 114 and the barrier ring 120, in the IMD layer 112A. These process steps may be repeated to form IMD layers 112B-112H and the corresponding metal features 116 disposed therein, and thereby complete the interconnect structure 114 and the barrier ring 120.

A planarization layer 122 may be disposed on the dielectric structure 112. The planarization layer 122 may be formed of a dielectric material, such as silicon oxide, silicon nitride, etc. Other dielectric materials are within the contemplated scope of disclosure. In some embodiments, a dielectric encapsulation (DE) layer (not shown) may be disposed around the semiconductor layer 106 and the dielectric structure 112. In some embodiments, the DE layer may include a molding compound. The molding compound may include a resin and a filler. In alternative embodiments, the DE layer may include silicon oxide, silicon nitride, or a combination thereof. The DE layer may be formed by spin-coating, lamination, deposition, or the like.

Figure 1B:
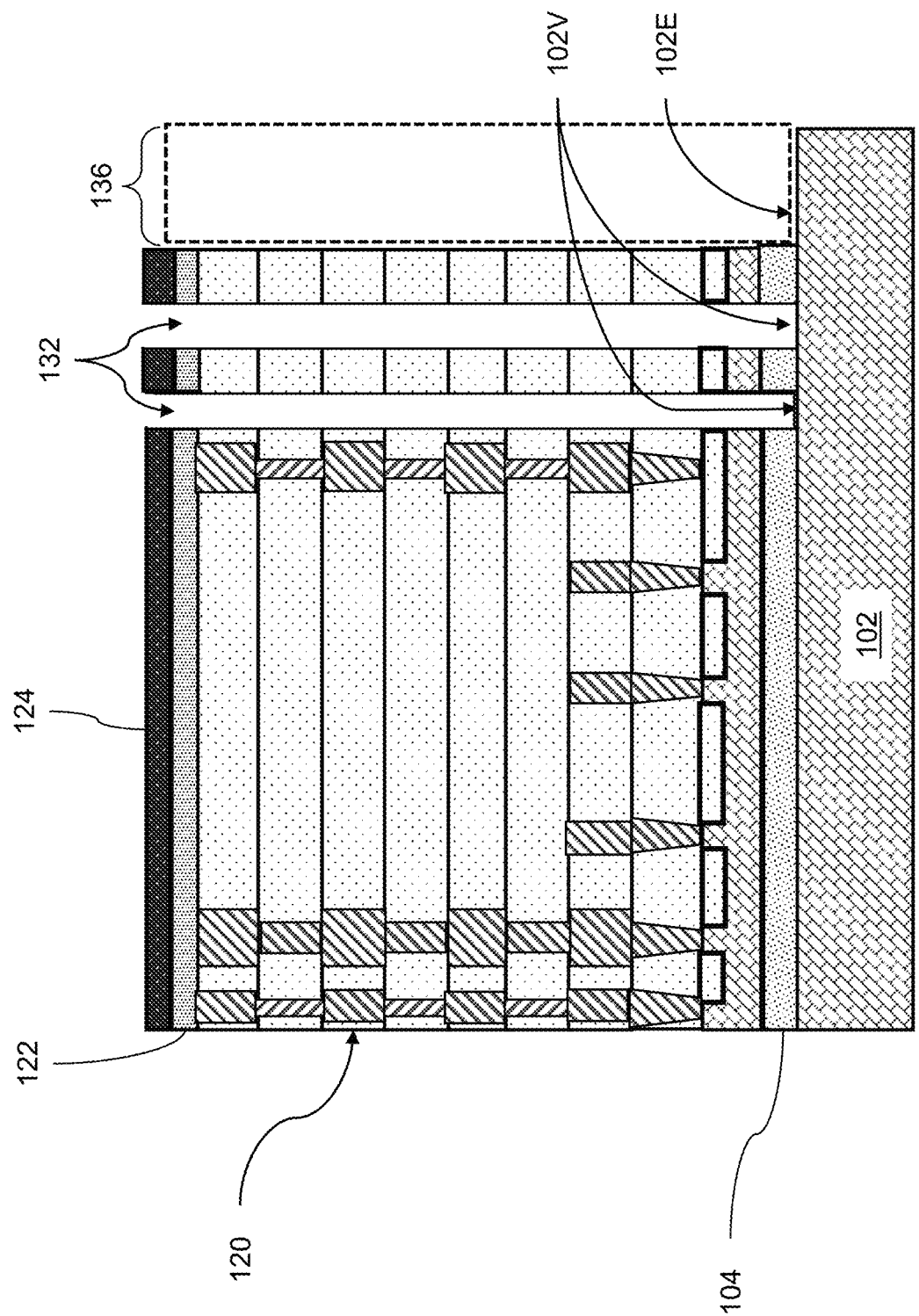
FIG. 1B is a vertical cross-sectional view illustrating an optical integrated circuit (IC) structure after the formation of vent and a fiber cavity according to various embodiments of the present disclosure.

Referring to FIG. 1B, a patterned photoresist layer 124 may be formed on the planarization layer 122. The photoresist layer 124 may be formed by coating a photoresist material on the planarization layer 122 (e.g., spin-on coating), soft baking, mask aligning, exposure, post-exposure baking, developing the photoresist, rinsing, drying (e.g., hard baking), and/or other applicable processes.

A first etching process may then be performed, using the photoresist layer 124 as a mask, to form a plurality of vents 132 and a fiber cavity 136 in the dielectric structure 112. In some embodiments, the plurality of vents 132 and fiber cavity may be formed in the DE layer. The first etching process may be an anisotropic dry etching process, such as a reactive ion etching process (e.g., plasma etching), configured to vertically etch the planarization layer 122, the dielectric structure 112, and the BOX 104. The plurality of vents 132 may expose vent regions 102V of the substrate 102, and the fiber cavity 136 may expose an edge region 102E of the substrate 102.

Figure 1C:
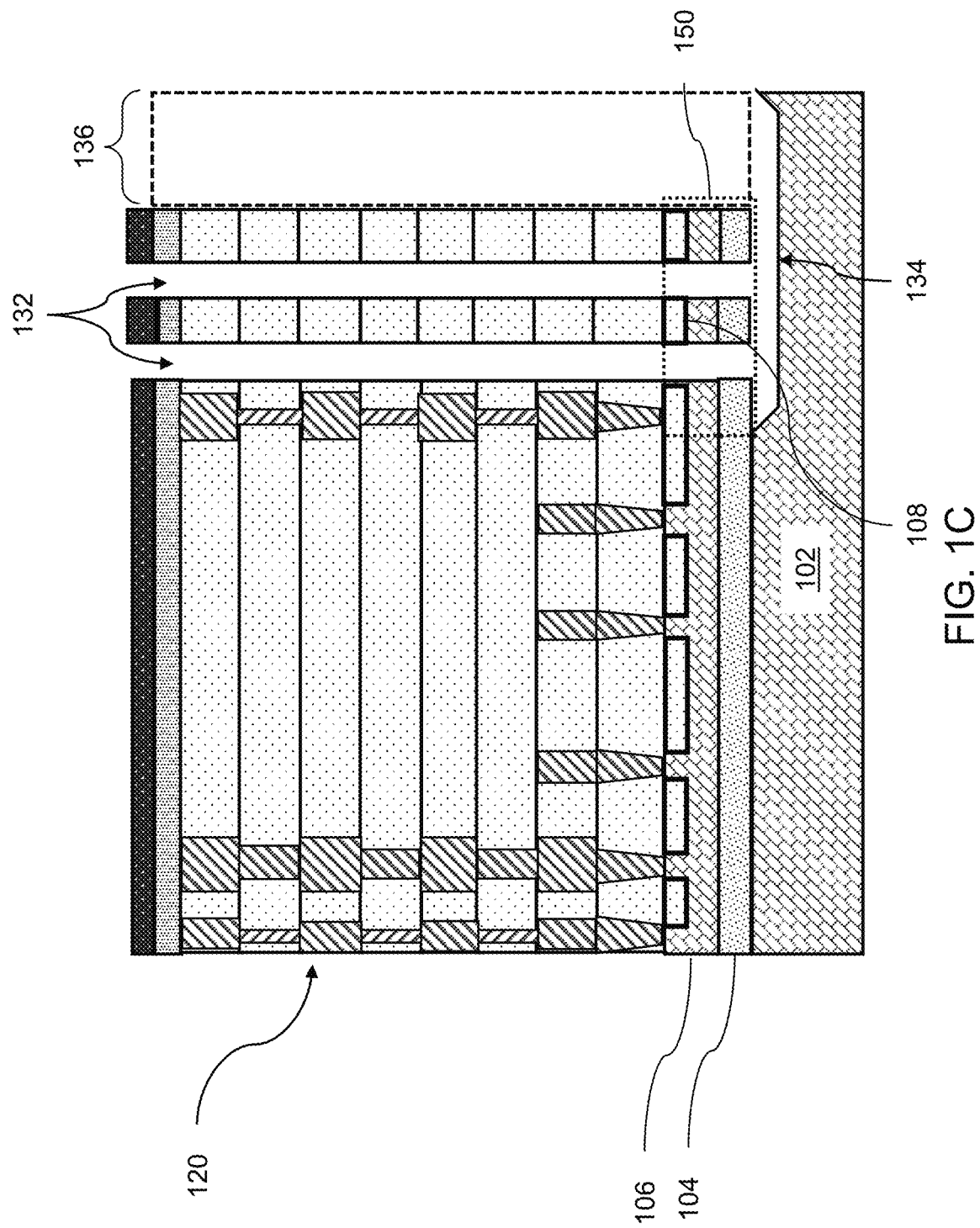
FIG. 1C is a vertical cross-sectional view illustrating an optical integrated circuit (IC) structure after the formation of an undercut region according to various embodiments of the present disclosure.

Referring to FIG. 1C, a second etching process may be performed to etch the vent regions 102V and the edge region 102E of substrate 102. The second etching process may be an isotropic wet etching process (e.g., acid etching process) that forms an undercut 134 in the substrate 102, below and adjacent to the plurality of vents 132 and the fiber cavity 136.

The photoresist layer 124 may be removed, by ashing or the like, after the second etching process. Portions of the semiconductor layer 106, the BOX 104 and/or the TOX 108, may extend between the plurality of vents 132 and may be suspended above the undercut 134 to form a waveguide region 150. In particular, air present in the undercut 134 may provide a refractive index difference sufficient to confine light in the waveguide region 150.

Figure 1D:
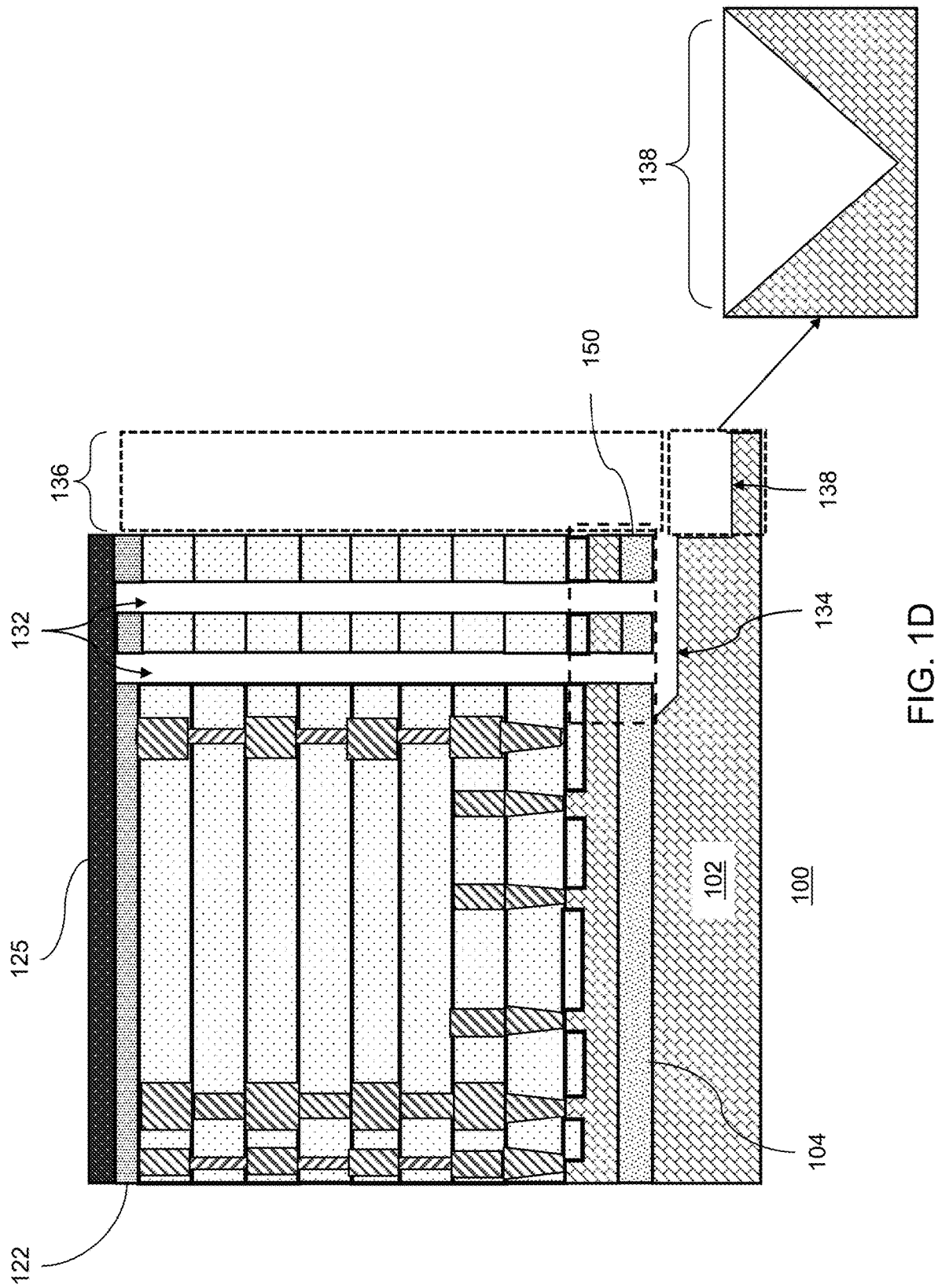
FIG. 1D is a vertical cross-sectional view illustrating an optical integrated circuit (IC) structure after the formation of a fiber slot according to various embodiments of the present disclosure.

Referring to FIG. 1D, an etching mask 125 may be disposed on the planarization layer 122. In particular, an opening of the etching mask 125 may be aligned with the fiber cavity 136. A third etching process may be performed through the etching mask 125 to form a fiber slot 138 in the substrate 102, below the fiber cavity 136. The third etching process may be an isotropic or anisotropic dry etching process, such as a reactive ion etching process (e.g., plasma etching). In some embodiments, the fiber slot 138 may be a V-shaped or a U-shaped trench formed in the substrate 102, depending on the shape of the opening in the etching mask 125. For example, with reference to FIG. 1D, a vertical cross section of the fiber slot 138 as viewed along a plane orthogonal to the plane of view of FIGS. 1A-1C illustrates the V-shaped fiber slot 138. After the third etching process is complete, the etching mask 125 may be removed to form an optical IC structure 100.

The undercut 134 may have a depth, taken in a vertical direction perpendicular to the plane of the substrate 102, from the bottom of the undercut 134 to the BOX 104, ranging from about 30 to about 70 μm, such as from about 40 to about 60 μm, or from about 45 to about 55 μm. Although deeper or shallower undercut 134 dimensions may be used. The fiber slot 138 may have a depth, taken in a vertical direction perpendicular to the plane of the substrate 102, from the bottom of the fiber slot 138 to the BOX 104, ranging from about 60 to about 100 μm, such as from about 75 to about 95 μm, or from about 70 to about 90 μm. Although deeper or shallower fiber slot 138 dimensions may be used.

Figure 1E:
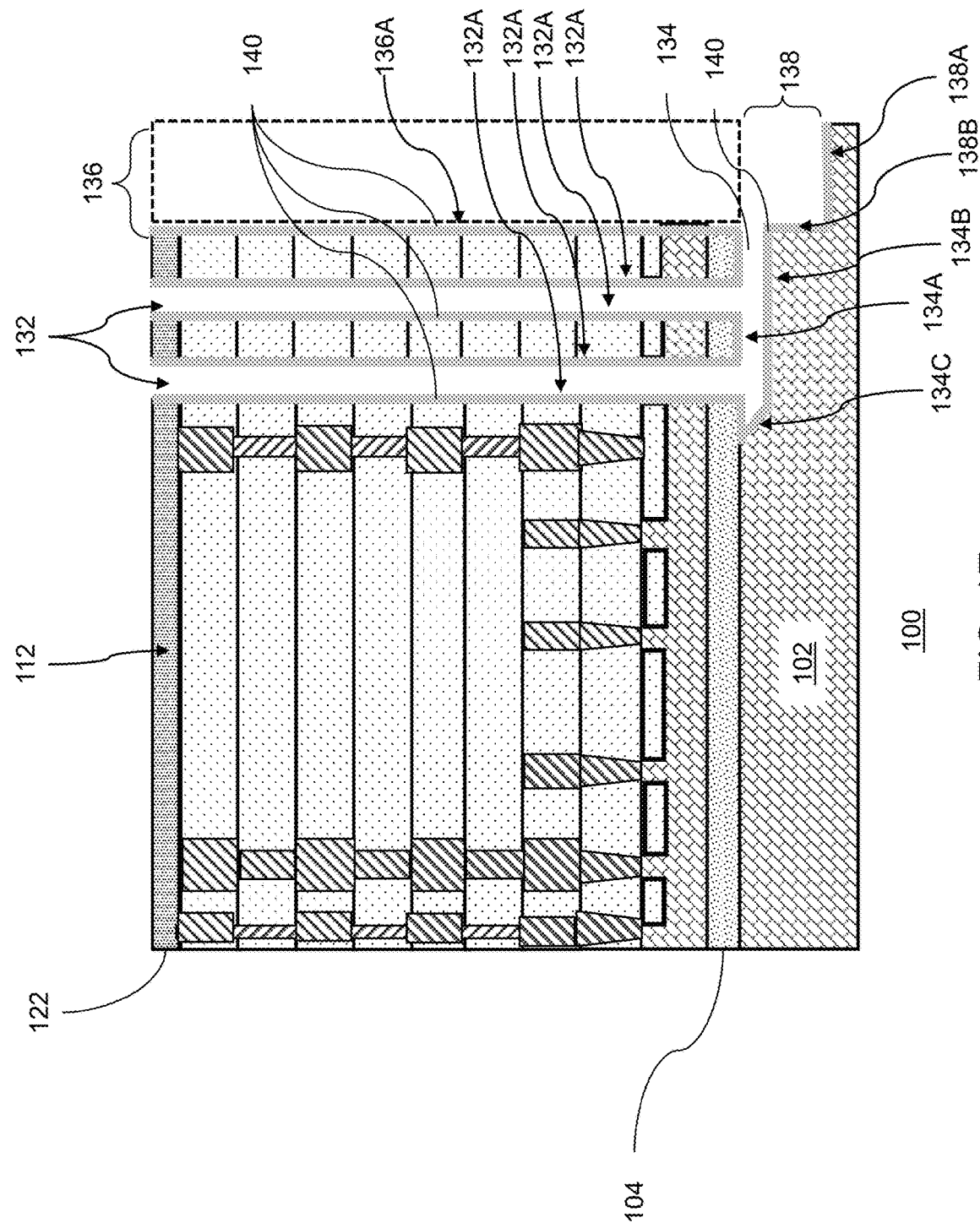
FIG. 1E is a vertical cross-sectional view illustrating an optical integrated circuit (IC) structure after the formation of a barrier layer according to various embodiments of the present disclosure.

Referring to FIG. 1E, an optional barrier layer 140 may be added to the IC structure 100. In particular, the barrier layer 140 may be disposed in (e.g. cover internal surfaces/sidewalls of) one or more of the plurality of vents 132 over vent sidewall surfaces 132A of each of the plurality of vents 132, an undercut top surface 134A, an undercut bottom surface 134B, an undercut side surface 134C, a fiber cavity sidewall surface 136A, and/or a fiber slot bottom surface 138A, and a fiber slot side surface 138B. In particular, the barrier layer 140 may cover internal surfaces of the plurality of vents 132, the undercut 134, the fiber cavity 136, and the fiber slot 138. The barrier layer 140 may have a thickness of at least 50 nm, such as a thickness ranging from about 50 to about 250 nm, such as from about 50 nm to about 100 nm, or about 50 nm, although a thicker or thinner barrier layer 140 may be used.

The barrier layer 140 may be formed by depositing a barrier material using any suitable deposition method, such as a chemical vapor deposition (CVD) process, a high-density plasma chemical vapor deposition (HDPCVD) process, an atomic layer deposition (ALD) process, a physical vapor deposition (PVD) process, another applicable process, or a combination thereof. The barrier layer 140 may be configured to prevent contaminants, such as water, ions, and/or etching byproducts that may enter through the plurality of vents 132, undercut 134, fiber cavity 136 and/or fiber slot 138 from diffusing into the dielectric structure 112, the BOX 104, and/or the substrate 102, and causing damage such as cracks or dislocations. For example, the barrier layer 140 may be formed of a dielectric barrier material, such as polyimide, silicon nitride, silicon oxynitride, or the like. In some embodiments, the IC structure 100 may be planarized, using a process such as chemical mechanical polishing (CMP), to remove any barrier material deposited on the planarization layer 122.

Figures 1F, 1G:
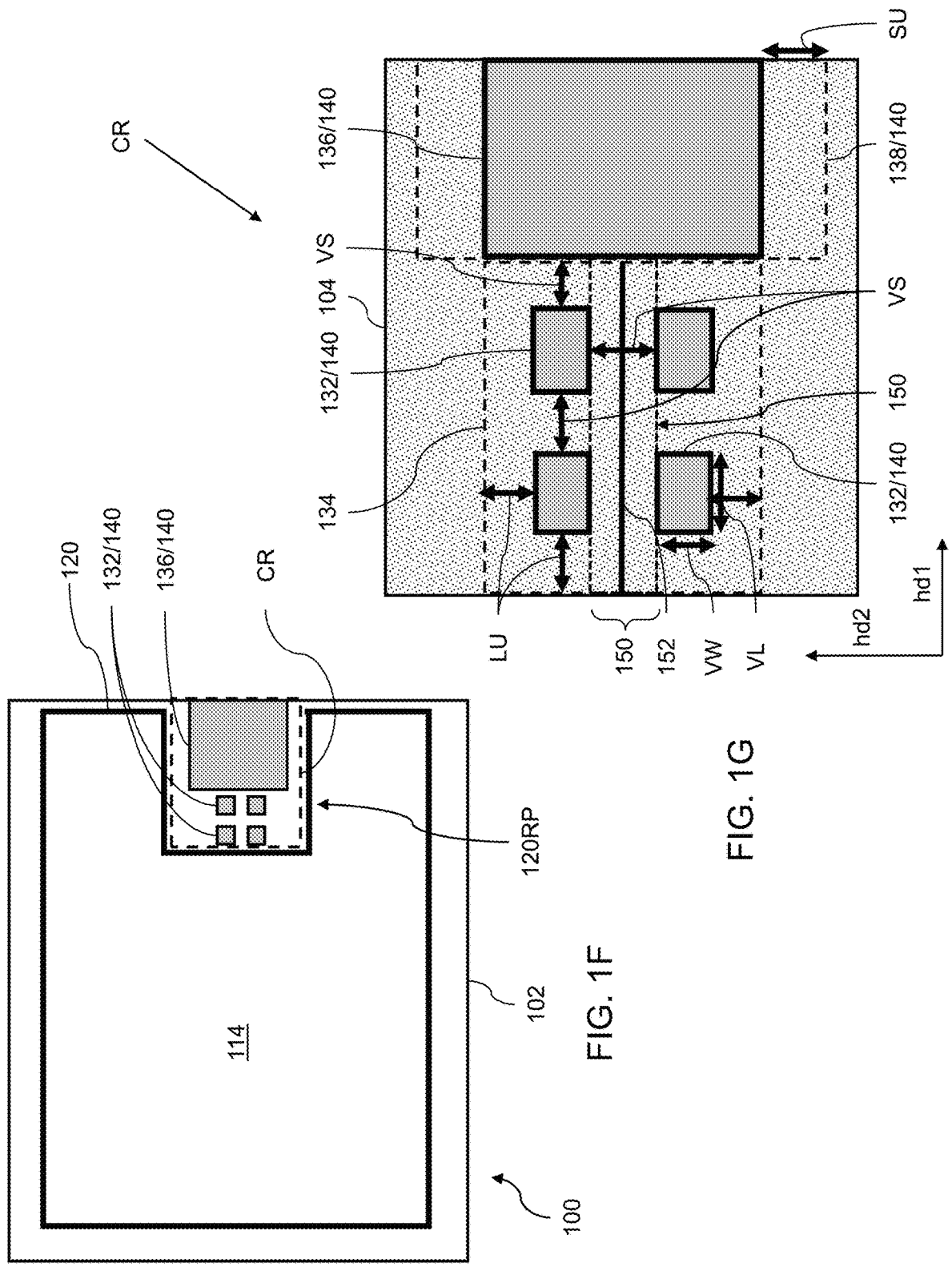
FIG. 1F is a top view of an optical integrated circuit (IC) structure after the formation of vent and a fiber cavity according to various embodiments of the present disclosure.
FIG. 1G is a top view illustrating an enlarged area of the vent and a fiber cavity according to various embodiments of the present disclosure.

FIG. 1F is a simplified top view of the IC structure 100 of FIG. 1E, and FIG. 1G shows an enlarged version of a coupling region CR of the IC structure 100 of FIG. 1F. Referring to FIGS. 1F and 1G, the coupling region CR of the IC structure 100 may include four vents 132 arranged on opposing sides of the waveguide region 150. However, the present disclosure is not limited to any particular number of vents 132. In other embodiments, more or fewer vents 132 may be formed on opposing sides of the waveguide region 150.

Each of the plurality of vents 132 may have a length VL taken in a first horizontal direction hd1 that ranges from about 20 to about 40 μm, such as from about 25 to about 35 μm, or about 30 μm, although the plurality of vents 132 may have longer or shorter vent lengths. Each of the plurality of vents 132 may have a width VW taken in second horizontal direction hd2 that ranges from about 10 to about 30 μm, such as from about 15 to about 25 μm, or about 20 μm, although each of the plurality of vents 132 may have wider or narrower vent widths. A vent-to-vent distance VV, taken between adjacent plurality of vents 132 in the first horizontal direction hd1 or the second horizontal direction hd2, may range from about 5 to about 20 μm, such as from about 8 to about 17 μm, or from about 10 to about 15 μm. Although the plurality of vents 132 may be spaced closer or further part in either the first horizontal direction hd1, second horizontal direction hd2 or both. A vent-to-slot distance VS taken in the first horizontal direction hd1 between the fiber slot 138 and the plurality of vents 132 adjacent thereto, may range from about 5 to about 20 μm, such as from about 8 to about 17 μm, or from about 10 to about 15 μm, although greater or lesser vent-to-slot VS distances may be used.

The undercut 134 may laterally extend outside of the plurality of vents 132 and undercut the BOX 104, by a distance LU of greater than 14 μm, such as distance ranging from about 14 to about 22 μm, from about 15 to about 20 μm, or from about 16 to about 17 μm. The fiber slot 138 may undercut the BOX 104 in the second horizontal direction hd2, by a distance SU ranging from about 30 to about 40 μm, from about 35 to about 45 μm, or from about 38 to about 42 μm, although greater or lesser distances may be used.

A portion of the semiconductor layer 106 in waveguide region 150 may form a waveguide 152. The waveguide 152 may be a protrusion, channel, or fin that is disposed between the BOX 104 and the TOX 108. The waveguide 152 may be formed by depositing and/or etching silicon disposed on the BOX 104 using any suitable deposition and/or etching method.

The barrier ring 120 may completely surround the interconnect structure 114 but may be routed around the perimeter of the coupling region CR. A recessed portion 120RP of the barrier ring 120 may be routed around the perimeter of the coupling region CR, so as to separate the coupling region CR from the interconnect structure 114. However, the barrier ring 120 may have any suitable shape, and is not limited to the configuration shown in FIG. 1F. In this manner, the devices 109 and interconnect structure 114 may be protected by the barrier ring 120 from any potential contaminants that may enter through the plurality of vents 132, fiber cavity 136, and fiber slot 138. The barrier ring 120 effectively provides a protective barrier around the devices 109 and interconnect structure 114 from exposure to elements intruding through the coupling region CR. In the embodiment illustrated in FIG. 1F, the additional protective barrier layer 140 that may be formed on the sidewalls of any and/or all of the plurality of vents 132, fiber cavity 136, and fiber slot 138, and may provide an additional protective layer that prevents the intrusion of contaminants that may enter through any and/or all of the plurality of vents 132, fiber cavity 136, and fiber slot 138 from damaging either the devices 109 and/or interconnect structure 114.

Figure 2:
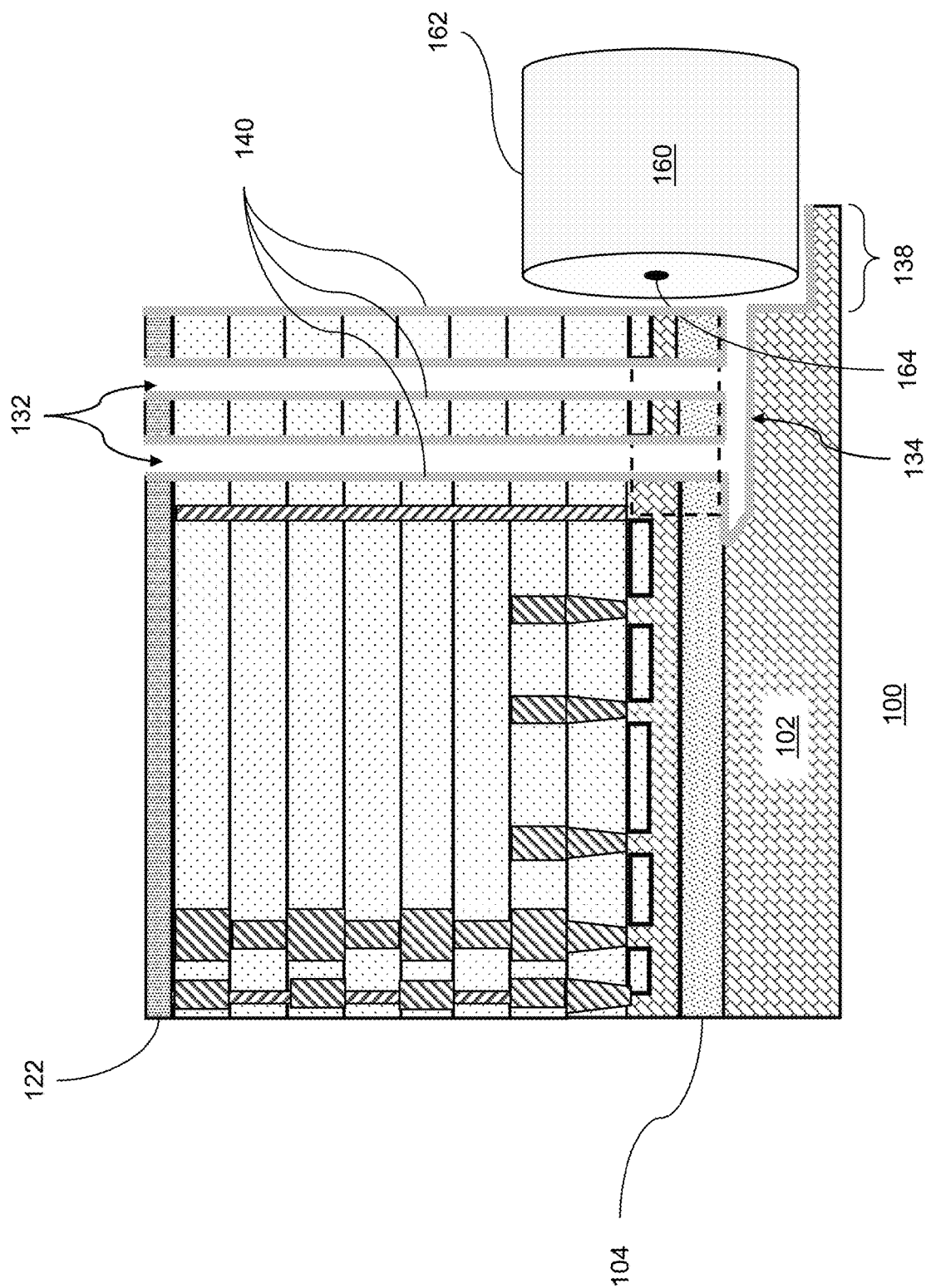
FIG. 2 is a vertical cross-sectional view of an optical IC structure connected to an optical fiber, according to various embodiments of the present disclosure.

FIG. 2 is a vertical cross-sectional view showing the IC structure 100 of FIG. 1E, when connected to an optical fiber 160. As shown in FIG. 2, the optical fiber 160 may include a cladding 162 and a core 164 having different refractive indexes. The optical fiber 160 may be seated in the fiber slot 138, such that the core 164 is aligned with the waveguide 152. In some embodiments, the optical fiber 160 may be fixed to the fiber slot 138 with an adhesive (not shown).

Figure 3C:
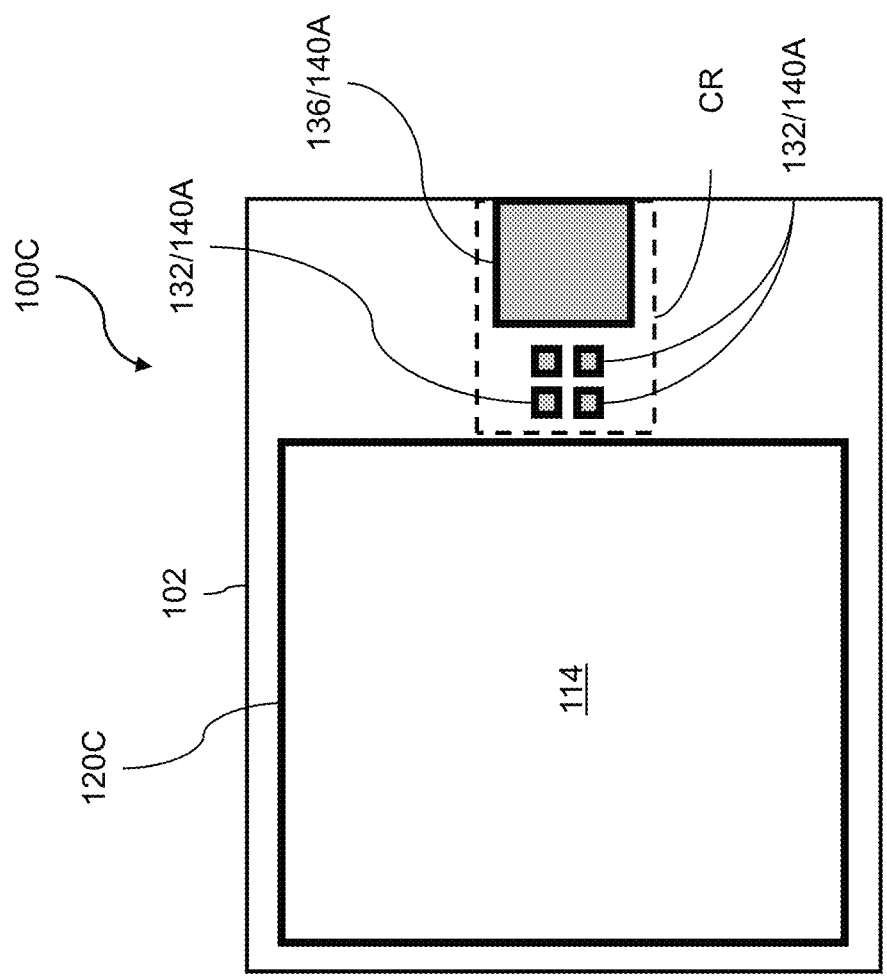

FIGS. 3A-3C are simplified top views respectively showing IC structures 100A, 100B, 100C, according to alternative embodiments of the present disclosure. The IC structures 100A, 100B, 100C, may be similar to the IC structure 100 of FIG. 1E. Accordingly, only the differences there between will be discussed in detail.

Referring to FIG. 3A, the IC structure 100A may include the barrier ring 120 that includes the recessed portion 120RP. However, in contrast to the embodiment illustrated in FIG. 1F, a barrier layer 140 may not be included in the plurality of vents 132, fiber cavity 136, and fiber slot 138. In the embodiment illustrated in FIG. 3A, the devices 109 and/or interconnect structure 114 may still be protected from contaminants entering through the plurality of vents 132, fiber cavity 136, and/or fiber slot 138 by the barrier ring 120 that may separate the devices 109 and/or interconnect structure 114 from the plurality of vents 132, fiber cavity 136, and/or fiber slot 138.

Referring to FIG. 3B, the IC structure 100B may include a barrier ring 120B and the barrier layer 140 formed in each of the plurality of vents 132, fiber cavity 136, and fiber slot 138. The barrier ring 120B may partially surround the devices 109 and interconnect structure 114. The barrier ring 120B may contact the barrier layer 140 disposed on the sidewalls of the fiber cavity 136. For example, the barrier ring 120B may contact portions of the barrier layer 140 that cover opposing sides of the fiber cavity 136. In the embodiment illustrated in FIG. 3B, the devices 109 and/or interconnect structure 114 may be protected from contaminants entering through the fiber cavity 136 and/or fiber slot 138 by the barrier ring 120B that couples with the barrier layer 140 formed in the fiber cavity 136 to form a continuous perimeter that isolates the devices 109 and/or interconnect structure 114 from any contaminants that may enter through the fiber cavity 136 and/or fiber slot 138. In addition, the barrier layer 140 formed in the plurality of vents 132 may isolate the devices 109 and/or interconnect structure 114 from any contaminants that may enter through the plurality of vents 132.

Referring to FIG. 3C, the IC structure 100C may include a barrier ring 120C and a barrier layer 140A. The barrier ring 120C may surround the devices 109 and interconnect structure 114, but may not include a recessed portion (i.e., 120RP) that is routed around the coupling region CR. The barrier layer 140A may be disposed in the fiber cavity 136, the fiber slot 138, the plurality of vents 132, and undercut 134. In the embodiment illustrated in FIG. 3C, the devices 109 and/or interconnect structure 114 may be protected from contaminants entering through the plurality of vents 132, fiber cavity 136, and/or fiber slot 138 by the barrier ring 120 that may separate the devices 109 and/or interconnect structure 114 from the plurality of vents 132, fiber cavity 136, and/or fiber slot 138. In addition, the barrier layer 140A formed in the plurality of vents 132, fiber cavity 136 and fiber slot 138 may further isolate the devices 109 and/or interconnect structure 114 from any contaminants that may enter through any of the plurality of vents 132, fiber cavity 136 and fiber slot 138.

Figure 4:
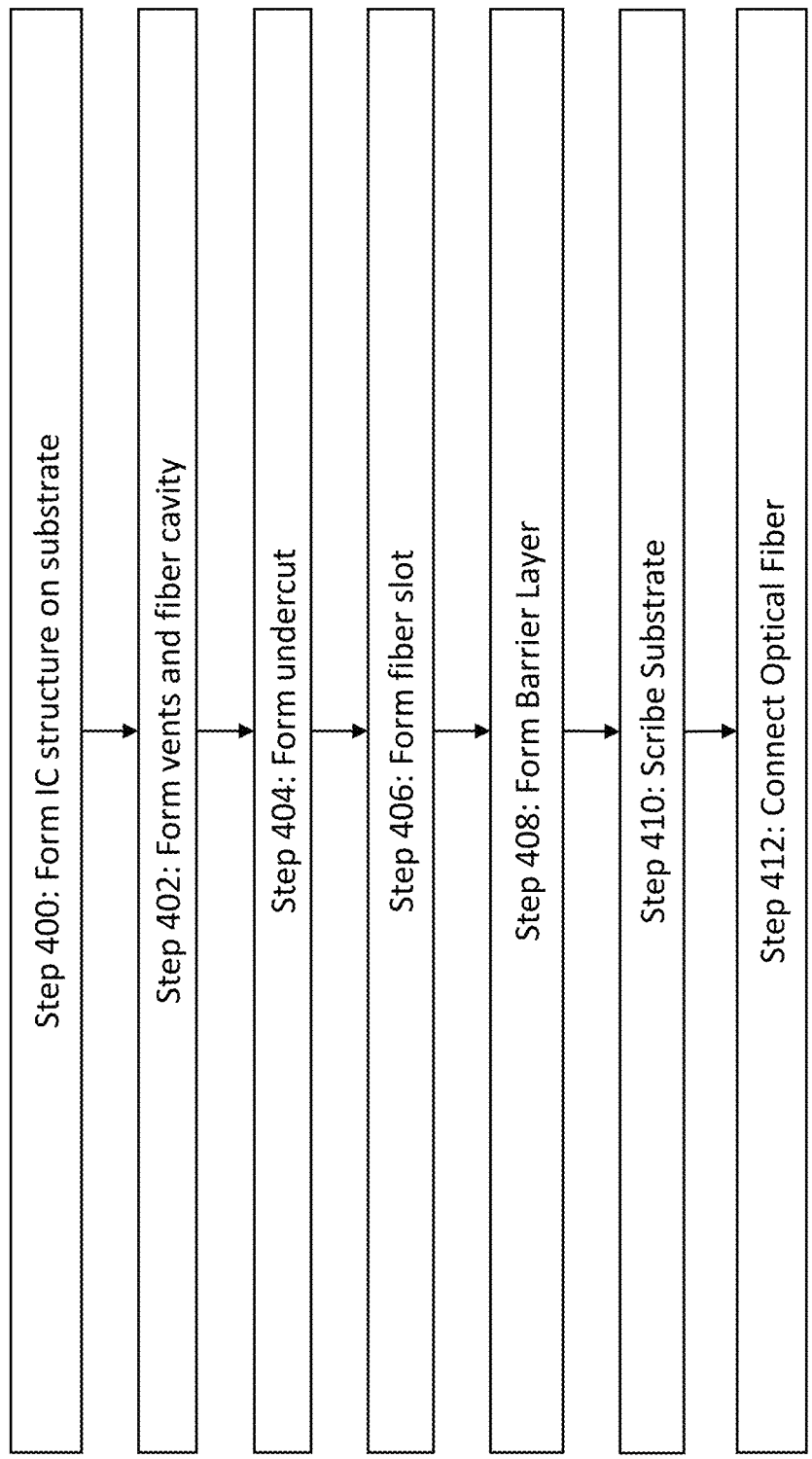
FIG. 4 is a flow chart showing a method of forming the IC structure as illustrated in FIGS. 1A-1G and 2, according to various embodiments of the present disclosure.

FIG. 4 is a flow chart showing a method of forming the IC structure 100 as shown in FIGS. 1A-2, according to various embodiments of the present disclosure. Referring to FIGS. 1A-2 and 4, in step 400 the IC structure 100 may be formed. For example, the semiconductor layer 106 may be formed on the BOX 104 of the substrate 102. The semiconductor layer 106 may be patterned and/or implanted with impurities to form the devices 109. The TOX 108 may then be formed on the semiconductor layer 106. The dielectric structure 112 may then be formed over the semiconductor layer 106 to complete the IC structure 100. For example, the dielectric structure 112, the interconnect structure 114, and the barrier ring 120 may be formed by depositing the IMD layers 112A-112E and the metal features 116 using, for example, single or dual Damascene processes. A portion of the dielectric structure 112 may be designated as a coupling region CR. The barrier ring 120 may be formed so as not to pass through and/or isolate the coupling region CR from the devices 109 and interconnect structure 114 as illustrated in FIGS. 1F, and 3A-3C discussed above. The planarization layer 122 may then be formed on the dielectric structure 112.

In step 402, a dry etching process may be used to form the plurality of vents 132 and the fiber cavity 136. In particular, a patterned photoresist layer 124 may be formed on the planarization layer 122, and the plurality of vents 132 and the fiber cavity 136 may be formed by dry-etching the planarization layer 122, the dielectric structure 112, the TOX 108, and/or the BOX 104, to expose the substrate 102.

In step 404, a wet etching process may be performed to form the undercut 134. In particular, the wet etching process may be used to vertically and horizontally etch the substrate 102. In particular, the lateral etching may result in the undercut 134 extending laterally below the BOX 104, outside of the perimeters of the plurality of vents 132 and the fiber cavity 136.

In step 406, a dry etching process may be performed to form the fiber slot 138. In particular, the etching mask 125 may be disposed on the planarization layer 122, and the substrate 102 may be dry-etched through an opening in the etching mask 125, to form the fiber slot 138.

In step 408, the barrier layer 140 may optionally be formed in the plurality of vents 132, undercut 134, fiber cavity 136, and/or fiber slot 138. In particular, the barrier layer 140 may be formed by depositing a dielectric material, using any suitable deposition method.

In step 410, the substrate 102 may be cut to separate the IC structure 100 from other IC structures formed on the substrate 102. In particular, the substrate 102 may be scribed and cut alone scribe lines during the scribing process.

In step 412, the method may optionally include connecting the optical fiber 160 to the IC structure 100. In particular, the optical fiber 160 may be inserted into the fiber slot 138, such that the core 164 of the optical fiber 160 may be aligned with the waveguide 152. The optical fiber 160 may be fixed to the fiber slot 138 using an adhesive.

Various embodiments provide an optical integrated circuit (IC) structure comprising: a substrate 102 comprising a fiber slot 138 formed in an upper surface of the substrate 102 and extending from an edge of the substrate 102, and an undercut 134 formed in the upper surface and extending from the fiber slot 138; a semiconductor layer 106 disposed on the substrate; a dielectric structure 112 disposed on the semiconductor layer 106; an interconnect structure 114 disposed in the dielectric structure 112; a plurality of vents 132 that extend through a coupling region CR of the dielectric structure 112, wherein the plurality of vents 132 each expose the undercut; a fiber cavity 136 that extends through the coupling region CR and exposes the fiber slot 138; and a barrier ring 120 disposed in the dielectric structure 112, wherein the barrier ring 120 surrounds the interconnect structure 114 and is routed around a perimeter of the coupling region CR. The undercut 134 may include an undercut top surface 134A, an undercut bottom surface 134B, and an undercut side surface 134C. The fiber slot 138 may include a fiber slot sidewall surface 138A and a fiber slot bottom surface 138B. The plurality of vents 132 may each comprise vent sidewall surfaces 132A. The fiber cavity 136 may comprise a fiber cavity bottom surface 136A and a fiber cavity sidewall surface 136A.

In an embodiment of the optical IC structure 100, the barrier ring 120 may be disposed to separate the interconnect structure 114 from the plurality of vents 132 and the fiber slot 138. The barrier ring 120 may be configured to prevent the diffusion of contaminants into the interconnect structure 114.

In various embodiments of the optical IC structure 100, the barrier ring 120 may be formed from a metal, such as copper or a copper alloy. The barrier ring 120 may have a thickness of at least 10 microns. The substrate 102 may include an optical waveguide 150 that is disposed over the undercut 134. The optical waveguide 150 may extend between the plurality of vents 132 to the fiber slot 138. In other embodiments, the optical IC structure 100 may further include a barrier layer 140 disposed on the vent sidewall surfaces 132A of each of the plurality of vents 132, the undercut top surface 134A, the undercut bottom surface 134B, the undercut side surface 134C, the fiber cavity sidewall surface 136A, the fiber slot bottom surface 138A and the fiber slot sidewall surface 138B. The barrier layer 140 may be formed from a dielectric barrier layer material and may have a minimum thickness of at least 10 microns.

Various embodiments provide an optical integrated circuit (IC) structure 100 comprising: a substrate 102 comprising a fiber slot 138 formed in an upper surface of the substrate 102 and extending from an edge of the substrate 102, and an undercut 134 formed in the upper surface and extending from the fiber slot 138, wherein the undercut 134 comprises an undercut top surface 134A, an undercut bottom surface 134B, and an undercut side surface 134C, and the fiber slot 138 comprises a fiber slot bottom surface 138A and a fiber slot sidewall surface 138B; a semiconductor layer 106 disposed on the substrate 102; a dielectric structure 112 disposed on the semiconductor layer 106; an interconnect structure 114 disposed in the dielectric structure 112; a plurality of vents 132 that extend through a coupling region CR of the dielectric structure 112, wherein the plurality of vents 132 each expose the undercut 134 and comprise vent sidewall surfaces 132A; a fiber cavity 136 that extends through the coupling region CR and exposes the fiber slot 138, wherein the fiber cavity 136 comprises a fiber cavity sidewall surface 136A; and a barrier layer 140 disposed on the vent sidewall surfaces 132A of the plurality of vents 132, the undercut top surface 134A, the undercut bottom surface 134B, and the undercut side surface 134C, the fiber cavity sidewall surface 136A, the fiber slot bottom surface 138A, and the fiber slot sidewall surface 138B.

In various embodiments of the optical IC structure 100, the barrier layer 140 may cover internal surfaces of the plurality of vents 132, the undercut 134, the fiber cavity 136, and the fiber slot 138. In other embodiments the barrier material may include a dielectric material. The barrier layer 140 may have a thickness of at least 50 nanometers. In another embodiment of the optical IC structure 100, the substrate 102 may include an optical waveguide 150 that is disposed over the undercut 134 and may extend between the plurality of vents 132 to the fiber slot 138. In another embodiment of the optical IC structure 100, the optical IC structure 100 may include a barrier ring 120 disposed in the dielectric structure 112, wherein the barrier ring 120 surrounds the interconnect structure 114 and contacts the barrier layer 140 on opposing sides of the fiber cavity 136. In another embodiment of the optical IC structure 100, the barrier ring 120 may be formed from a metal. In another embodiment of the optical IC structure 100, the barrier ring 120 and the interconnect structure 114 may be formed from copper or a copper alloy.

Various embodiments provide a method of forming an optical integrated circuit (IC) structure 100 that include the steps of: forming an dielectric structure 112 comprising an interconnect structure 114 and a barrier ring, 120 on a semiconductor layer 106 disposed on a substrate 102; performing a first etching process to form a plurality of vents 132 and a fiber cavity 136 in a coupling region CR of the dielectric structure 112, to expose portions of the substrate 102; performing a second etching process to etch the substrate 102 and form an undercut 134 below the plurality of vents 132 and the fiber cavity 136; and performing a third etching process to etch the substrate 102 and form a fiber slot 138 below the fiber cavity 136. The barrier ring 120 surrounds the interconnect structure 114 and is disposed between the coupling region CR and the interconnect structure 114.

In various embodiments, the first etching process may include a dry etching process, the second etching process may include a wet etching process, and the third etching process may include a dry etching process. In other embodiments the method of may include forming a barrier layer 140 on vent sidewall surfaces 132A of each of the plurality of vents 132, an undercut top surface 134A, an undercut bottom surface 132B, an undercut side surface 134C, a fiber cavity sidewall surface 136A, a fiber slot bottom surface 138A, and a fiber slot sidewall surface 138B. The barrier layer 140 may include a barrier layer material configured to prevent the diffusion of contaminants there through, and the barrier ring 120 may extend from a barrier layer 140 formed on opposing sides of the coupling region.

The various embodiments disclosed herein provide a structure that may allow an optical IC structure 100 to be coupled with an optical fiber 160 while protecting the devices 109 and the interconnect structure 114 from potential contaminants that may enter through the plurality of vents 132, undercut 134, fiber cavity 136, and fiber slot 138. The various embodiments may implement a barrier ring 120, 120B that isolates the devices 109 and the interconnect structure 114 from the plurality of vents 132, undercut 134, fiber cavity 136, and fiber slot 138. In some embodiments, an additional barrier layer 140 may be formed within the plurality of vents 132, undercut 134, fiber cavity 136, and fiber slot 138 to further isolate the devices 109 and the interconnect structure 114 and protect the devices 109 and the interconnect structure 114 from contaminants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical integrated circuit (IC) structure comprising:
   a substrate comprising a fiber slot formed in an upper surface of the substrate and extending from an edge of the substrate, and an undercut formed in the upper surface and extending from the fiber slot;
   a bottom oxide layer disposed on the substrate;
   a semiconductor layer disposed on the bottom oxide layer;
   vents that extend through the semiconductor layer and the bottom oxide layer to expose the undercut; and
   a barrier layer disposed on surfaces of the vents, the undercut, and the fiber slot.

2. The IC structure of claim 1, further comprising:
   a dielectric structure disposed on the semiconductor layer;
   an interconnect structure disposed in the dielectric structure; and
   a barrier ring disposed in the dielectric structure and surrounding the interconnect structure.

3. The IC structure of claim 2, wherein the barrier ring separates the interconnect structure from the vents and the fiber slot, and the barrier ring is configured to prevent contaminants from diffusing into the interconnect structure.

4. The IC structure of claim 2, wherein:
   the barrier ring and the interconnect structure comprise copper or a copper alloy; and
   the barrier ring has a thickness of at least 10 microns.

5. The IC structure of claim 2, further comprising a fiber cavity that extends through the semiconductor layer and the bottom oxide layer to expose the fiber slot.

6. The IC structure of claim 1, wherein a portion of the semiconductor layer that is disposed over the undercut and extends between the vents is configured to operate as an optical waveguide.

7. The IC structure of claim 1, wherein the barrier layer comprises a dielectric material.

8. The IC structure of claim 7, wherein the barrier layer has a thickness of at least 10 microns.

9. An optical integrated circuit (IC) structure comprising:
   a substrate comprising a fiber slot formed in an upper surface of the substrate and extending from an edge of the substrate, and an undercut formed in the upper surface and extending from the fiber slot;
   a semiconductor layer disposed on the substrate;
   a dielectric structure disposed on the semiconductor layer;
   vents that extend through a coupling region of the dielectric structure and expose the undercut; and
   a dielectric material disposed on surfaces of the vents, the undercut, and the fiber slot.

10. The IC structure of claim 9, wherein the dielectric material has a thickness of at least 50 nanometers.

11. The IC structure of claim 9, further comprising:
    an interconnect structure disposed in the dielectric structure; and
    a barrier ring disposed in the dielectric structure and surrounding the interconnect structure.

12. The IC structure of claim 11, wherein the barrier ring and the interconnect structure comprise copper or a copper alloy.

13. The IC structure of claim 11, further comprising a fiber cavity that extends through the dielectric structure and exposes the fiber slot.

14. The IC structure of claim 13, wherein:
    the dielectric material is disposed on surfaces of the fiber cavity; and
    the barrier ring contacts the dielectric material on opposing sides of the fiber cavity.

15. The IC structure of claim 9, wherein the substrate comprises an optical waveguide that is disposed over the undercut and that extends between the vents to the fiber slot.

16. An optical integrated circuit (IC) structure comprising:
    a substrate comprising a fiber slot formed in an upper surface of the substrate and extending from an edge of the substrate, and an undercut formed in the upper surface and extending from the fiber slot;

a semiconductor layer disposed on the substrate and comprising an optical waveguide disposed over the undercut;

inter-metal dielectric (IMD) layers disposed on the semiconductor layer;

vents that extend through the IMD layers and the semiconductor layer to expose the undercut;

an interconnect structure disposed in the IMD layers; and a barrier ring disposed in the IMD layers and surrounding the interconnect structure.

17. The IC structure of claim 16, further comprising:

a fiber cavity that extends through the IMD layers and the semiconductor layer to expose the fiber slot; and a barrier layer disposed on surfaces of the vents, the undercut, the fiber slot, and the fiber cavity.

18. The IC structure of claim 16, wherein the optical waveguide is disposed between the vents.

19. The IC structure of claim 16, wherein the barrier ring separates the interconnect structure from the vents and the fiber slot, and the barrier ring is configured to prevent contaminants from diffusing into the interconnect structure.

20. The IC structure of claim 16, wherein:

the barrier ring and the interconnect structure comprise copper or a copper alloy; and the barrier ring has a thickness of at least 10 microns.

* * * * *